United States Patent
Hsieh

(10) Patent No.: US 7,168,961 B2
(45) Date of Patent: Jan. 30, 2007

(54) EXPANSIBLE INTERFACE FOR MODULARIZED PRINTED CIRCUIT BOARDS

(75) Inventor: Ming-Chih Hsieh, Tu-Cheng (TW)

(73) Assignee: Hon Hai Precision Industry Co., Ltd. (TW)

( * ) Notice: Subject to any disclaimer, the term of this patent is extended or adjusted under 35 U.S.C. 154(b) by 0 days.

(21) Appl. No.: 11/114,702

(22) Filed: Apr. 26, 2005

(65) Prior Publication Data

US 2006/0009048 A1    Jan. 12, 2006

(30) Foreign Application Priority Data

Aug. 7, 2004    (CN)    ................ 2004 2 0072557

(51) Int. Cl.
*H01R 12/00* (2006.01)
(52) U.S. Cl. ................ 439/74; 439/77; 361/789
(58) Field of Classification Search ................ 439/65, 439/67, 541.5, 74, 77; 361/789, 785
See application file for complete search history.

(56) References Cited

U.S. PATENT DOCUMENTS

RE34,190 E * 3/1993 Rubinstein ............ 439/67
5,754,796 A * 5/1998 Wang et al. ............ 710/301
6,004,139 A * 12/1999 Dramstad et al. ............ 439/59
6,356,959 B1 * 3/2002 Thomas et al. ............ 710/2
6,781,845 B1 * 8/2004 Chang ............ 361/736
2003/0114043 A1 * 6/2003 Kuo ............ 439/541.5

FOREIGN PATENT DOCUMENTS

CN    2567805 Y    8/2003
TW    458306    10/2001

* cited by examiner

*Primary Examiner*—X. Chung-Trans
(74) *Attorney, Agent, or Firm*—Morris Manning & Martin LLP; Tim Tingkang Xia, Esq.

(57) ABSTRACT

An expansible interface for expanding different kinds of data from a primary printed circuit board (PCB) (1) to a subsidiary PCB (2), the primary PCB is fixed with board-to-board connectors (13, 14) and flexible printed circuit (FPC) connectors (11, 12), and the subsidiary PCB is fixed with the corresponding board-to-board connectors (23, 24) and the corresponding FPC connectors (21, 22). The board-to-board connectors are directly electrically connected with each other for transmitting a data that is not a Peripheral Component Interconnect (PCI) data from the primary PCB to the subsidiary PCB; the FPC connectors are electrically connected with each other via cables (31, 32) for transmitting the PCI data from the primary PCB to the subsidiary PCB.

11 Claims, 3 Drawing Sheets

EXPANSIBLE INTERFACE FOR MODULARIZED PRINTED CIRCUIT BOARDS

BACKGROUND OF THE INVENTION

1. Field of the Invention

The present invention relates to expansible interfaces of electronic devices, and particularly to an expansible interface for modularized printed circuit boards (PCBs).

2. Prior Art

Nowadays, modularized PCBs that comprise a primary PCB and a subsidiary PCB are broadly employed in many electronic devices. The primary PCB of the modularized PCBs is assembled with a plurality of main components such as a central processing unit (CPU) and a memory. The subsidiary PCB of the modularized PCBs is an expansible board ancillary to the primary PCB, and is coupled to the primary PCB to form a unified PCB assembly. The modularized PCBs are generally used in routers, uninterruptible power supplies (UPSs), and so on.

Taiwan Patent Publication No. 458,306, issued on Oct. 01, 2001, discloses an expansible interface for modularized PCBs. Referring to FIG. 4, a primary PCB 5 is provided with a CPU 51 and a connector 50. A subsidiary PCB 4 is configured with a connector 40 and a plurality of expansion slots 41. In this invention, the connector 50 on the primary PCB 5 is coupled to the connector 40 on the subsidiary PCB 4 to form a unified PCB assembly for connecting more peripheral devices via the expansion slots 41. The connector 50 on the primary PCB 5 is also electrically connected to a bus on the primary PCB 5, for transmitting data in the bus to the subsidiary PCB 4. The data transmitted by the connector 50 may be Industry Standard Architecture (ISA) data, Peripheral Component Interconnect (PCI) data, or both. However, the electronic device employing the above-mentioned modularized PCBs is not adapted to the market requirements. Because the electronic devices are developed toward light, thin, short and small, the above-mentioned modularized PCBs are inevitably large.

China Patent No. 02248010.2, issued on Aug. 20, 2003, discloses a board-to-board connector assembly. This invention provides an assembly of the modularized PCBs in which the primary PCB and the subsidiary PCB are set in parallel. Although the space occupied by the PCBs is reduced, the communication between the primary PCB and the subsidiary PCB is still inconvenient to use.

In view of the above-mentioned shortcomings, there is a need for an expansible interface for modularized PCBs, for transmitting different kinds of data from the primary PCB to the subsidiary PCB.

SUMMARY OF THE INVENTION

An objective of the invention is to provide an expansible interface for transmitting different kinds of data from a primary printed circuit board (PCB) to a subsidiary PCB.

In order to accomplished the above-mentioned objective, a preferred embodiment of the expansible interface for expanding different kinds of data from a primary PCB to a subsidiary PCB, the primary PCB is fixed with board-to-board connectors and flexible printed circuit (FPC) connectors, and the subsidiary PCB is fixed with the corresponding board-to-board connectors and the corresponding FPC connectors. The board-to-board connectors are directly electrically connected with each other for transmitting a data that is not a Peripheral Component Interconnect (PCI) data from the primary PCB to the subsidiary PCB; the FPC connectors are electrically connected with each other via cables for transmitting the PCI data from the primary PCB to the subsidiary PCB.

Other objects, advantages and novel features of the present invention will be drawn from the following detailed description of a preferred embodiment of the present invention with the attached drawings, in which:

DETAILED DESCRIPTION OF THE INVENTION

Figure 1:
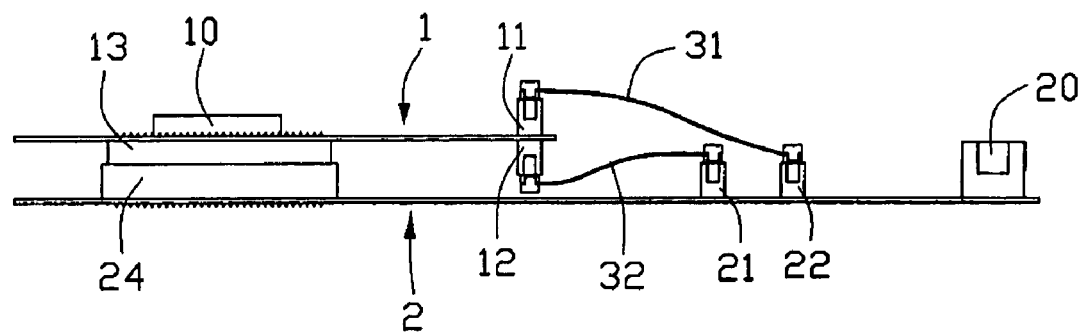
FIG. 1 is a side plan view of an expansible interface for modularized PCBs in accordance with the preferred embodiment of the present invention.
Figure 2:
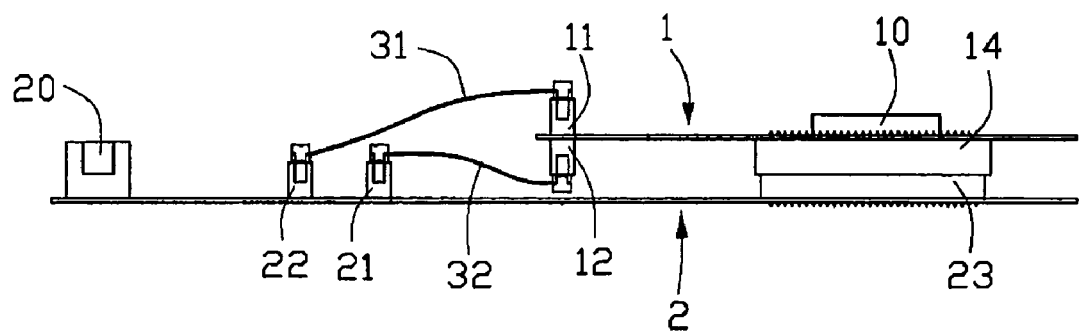
FIG. 2 is an opposite side plan view of the expansible interface for the modularized PCBs in accordance with the preferred embodiment of the present invention.
Figure 3:
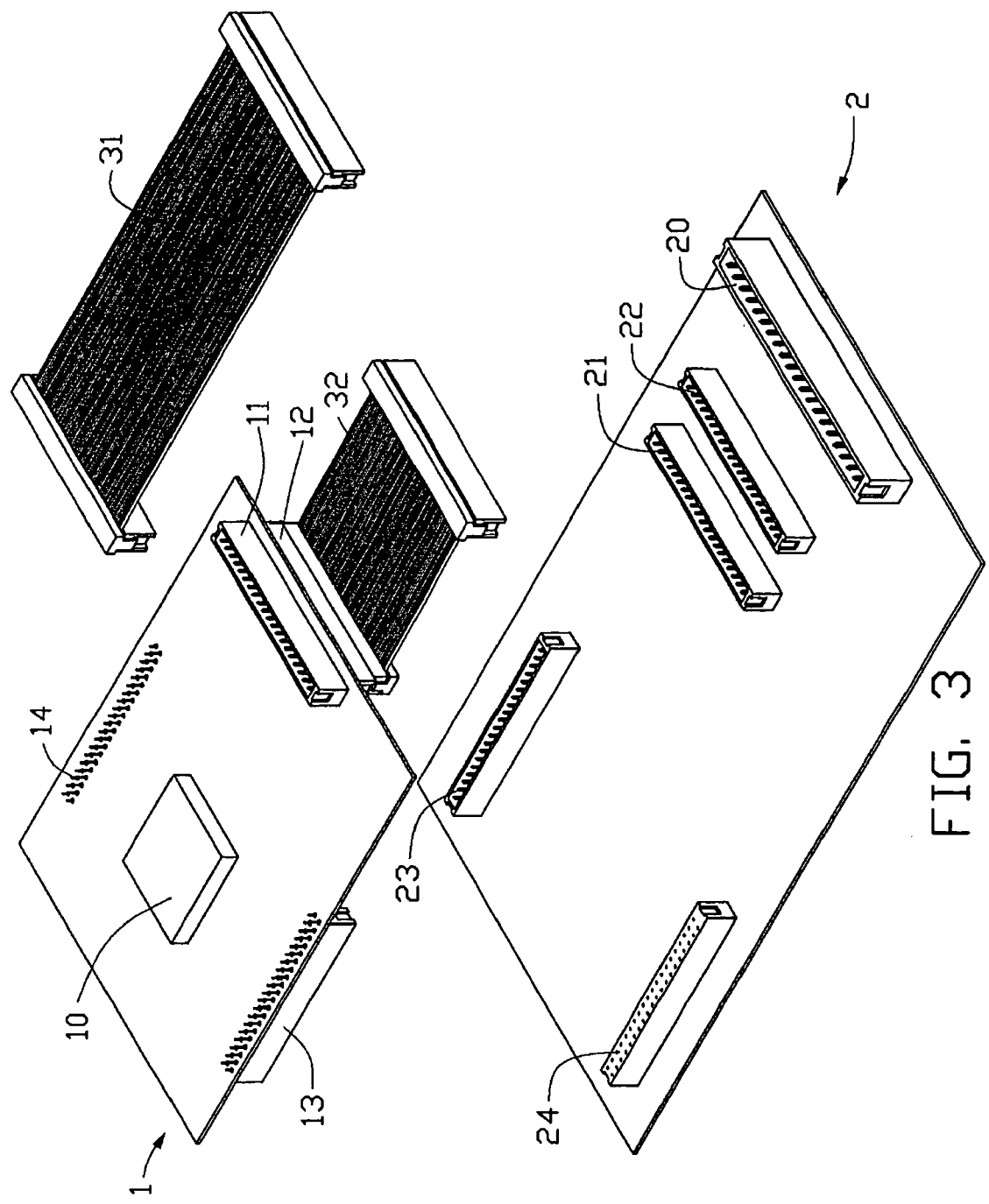
FIG. 3 is an exploded, isometric view of the expansible interface for modularized PCBs in accordance with the preferred embodiment of the present invention.
Figure 4:
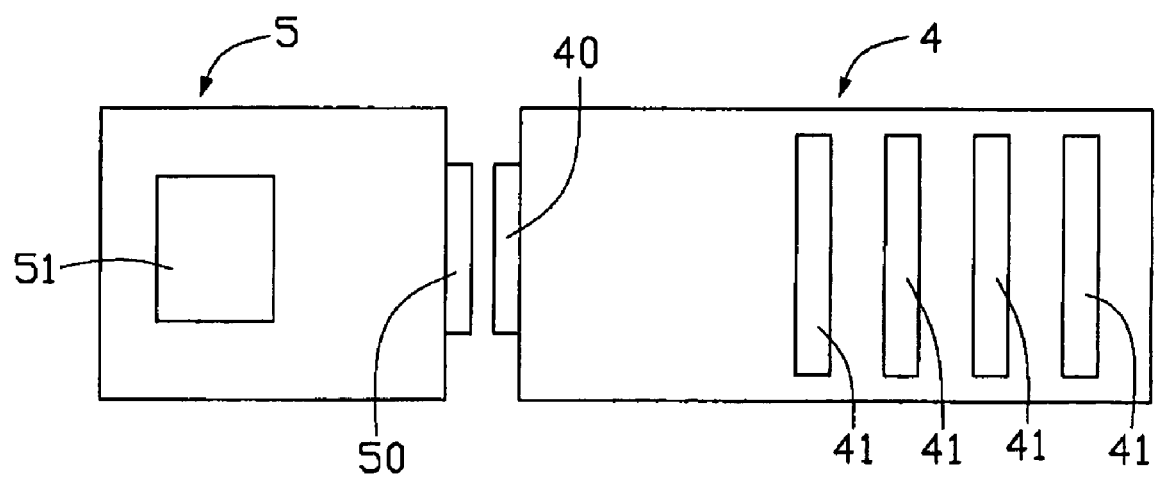
FIG. 4 is a schematic, top plan view of a conventional expansible interface for modularized PCBs.

FIG. 1 is a side plan view of an expansible interface for modularized PCBs in accordance with the preferred embodiment of the present invention. FIG. 2 is an opposite side plan view of the expansible interface for modularized PCBs in accordance with the preferred embodiment of the present invention. FIG. 3 is an exploded, isometric view of the expansible interface for modularized PCBs in accordance with the preferred embodiment of the present invention. In the preferred embodiment, the modularized PCBs comprise a primary PCB 1, a subsidiary PCB 2, and connectors 13, 14, 23, 24. The connectors 13, 14 are fixed on a same side of the primary PCB 1, and the connectors 23, 24 are fixed on a same side of the subsidiary PCB 2. In addition, the primary PCB 1 is assembled with connectors 11, 12 respectively on an upper side and on a lower side thereof, and a CPU 10 on the upper side thereof. The subsidiary PCB 2 is assembled with connectors 21, 22 and a plurality of PCI slots 20 (only one shown), all on an upper side thereof.

In the preferred embodiment, the primary PCB 1 is assembled with most of the main components of an electronic device, and the subsidiary PCB 2 is an expansion board ancillary to the primary PCB 1. The primary PCB 1 and the subsidiary PCB 2 are connected with each other not only via interconnection of the connectors 13, 24 and interconnection of the connectors 14, 23, but also via interconnection of the connectors 11, 22 and interconnection of the connectors 12, 21, in order to transmit different kinds of data. In the preferred embodiment, PCI data is transmitted from the primary PCB 1 to the subsidiary PCB 2 via the connectors 11 and 12, cables 31 and 32, and the connectors 22 and 21; and other data that are not PCI data are transmitted from the primary PCB 1 to the subsidiary PCB 2 via the connector matches 13, 24 and 14, 23. Therefore, the subsidiary PCB 2 can share the PCI data and the other data with the primary PCB 1. Thus the PCBs 1, 2 can expandably connect more peripheral devices compatible to PCI interfaces and other interfaces at the same time. In the preferred embodiment, one of the PCI interfaces is a Mini PCI interface, and the cables 31 and 32 are Flexible Printed Circuit (FPC) cables. Correspondingly, the connectors 11, 12, 21 and 22 are FPC connectors. In alternative embodiments of the present invention, the cables 31 and 32 may be other kinds of cables, and the connectors 11, 22 and 12, 21 are corresponding kinds of connectors.

In the preferred embodiment, the PCI bus of the CPU 10 has 100 pins, and one FPC connector has only 50 pins. This means it is necessary to use the two FPC connectors 11 and 12 in order to transmit all of the PCI data from the primary PCB 1 to the subsidiary PCB 2. Because of limited space on the primary PCB 1, the connectors 11 and 12 that are connected to the CPU 10 via the PCI bus are positioned respectively on the upper side and the lower side of the primary PCB 1. The connectors 11 and 12 can be otherwise arranged as desired. For example, the connectors 11 and 12 can both be positioned on the upper side of the primary PCB 1, if the primary PCB 1 has enough space. The subsidiary PCB 2 is fixed with the connector 22, which is coupled to the connector 11, and with the connector 21, which is coupled to the connector 12. The connectors 21 and 22 are parallel to each other on the same side of the subsidiary PCB 2, and are connected to the PCI slots 20 via the PCI bus (not shown). The connector 11 on the primary PCB 1 is connected to the connector 22 on the subsidiary PCB 2 by the cable 31, and the connector 12 on the primary PCB 1 is connected to the connector 21 on the subsidiary PCB 2 by the cable 32. The PCI data are transmitted from the connectors 11 and 12 on the primary PCB 1 to the connectors 22 and 21 on the subsidiary PCB 2 via the cables 31 and 32. Therefore, the subsidiary PCB 2 shares the PCI data with the primary PCB 1, and the subsidiary PCB 2 can use the PCI slots 20 for insertion of peripheral cards such as network cards and sound cards compatible with the PCI standard.

Although only a preferred embodiment of the present invention has been described in detail above, those skilled in the art will readily appreciate that many modifications to the preferred embodiment are possible without materially departing from the novel teachings and advantages of the present invention. Accordingly, all such modifications are deemed to be covered by the following claims and allowable equivalents of the claims.

I claim:

1. An expansible interface for expanding different kinds of data from a primary printed circuit board (PCB) to a subsidiary PCB, the expansible interface comprising:
    two first connectors on a lower side of the primary PCB;
    two corresponding first connectors on an upper side of the subsidiary PCB;
    two second connectors respectively disposed respectively on an upper side and the lower side of the primary PCB, wherein the two second connectors are two Peripheral Component Interconnect (PCI) interfaces that cooperate to act as a common PCI interface; and
    two corresponding second connectors disposed on the upper side of the subsidiary PCB;
    wherein said two first connectors are directly electrically connected with said two corresponding first connectors, for transmitting a first kind of data from the primary PCB to the subsidiary PCB, thus the primary PCB is stacked in parallel with the subsidiary PCB; and
    said two second connectors are electrically connected with said two corresponding second connectors via cables for transmitting a second kind of data from the primary PCB to the subsidiary PCB.

2. The expansible interface as claimed in claim 1, wherein the primary PCB is provided with a central processing unit (CPU) communicating with the first connectors and the second connectors thereof via buses.

3. The expansible interface as claimed in claim 1, wherein the subsidiary PCB is provided with a plurality of bus slots communicating with the first connectors and the second connectors thereof via buses.

4. The expansible interface as claimed in claim 1, wherein the second connectors on the primary PCB and on the subsidiary PCB are flexible printed circuit (FPC) connectors.

5. The expansible interface as claimed in claim 1, wherein the cables are flexible printed circuit (FPC) cables.

6. The expansible interface as claimed in claim 1, wherein said two PCI interfaces each have 50 pins.

7. A method to expand an interface from a primary printed circuit board (PCB) to a subsidiary PCB, comprising the steps of:
    arranging a part of said interface on an upper side of said primary PCB, and another pad of said interface on a lower side of said primary PCB;
    providing an electrical connector on said subsidiary PCB compatible for said interface;
    stacking said primary PCB with said subsidiary PCB in a side-by-side, parallel relationship; and
    electrically connecting said primary PCB and said subsidiary PCB so that said electrical connector is controllable by and data-communicable with said primary PCB to perform said interface, wherein at least one flexible printed circuit (FPC) cable is provided to electrically connect said electrical connector of said subsidiary PCB to said interface of said primary PCB.

8. The method as claimed in claim 7, wherein said interface is a Mini Peripheral Component Interconnect (PCI) interface and said subsidiary PCB is a PCI compatible PCB.

9. The method as claimed in claim 8, wherein the electrical connector on said subsidiary PCB comprises two electrical connectors respectively compatible wit the two parts of the PCI interface, two FPC cables are provided to connect the two electrical connectors to the two parts of the PCI interface in order to transmit all PCI data from the primary PCB to the subsidiary PCB.

10. A method to expand an interface from a primary printed circuit board (PCB) to a subsidiary PCB, comprising the steps of:
    providing an electrical connector on said subsidiary PCB compatible for said interface; and
    electrically connecting said primary PCB and said subsidiary PCB by means of at least two sets of electrical interconnection compatible to said interface between said primary PCB and said subsidiary PCB so that said electrical connector is controllable by and data-communicable with said primary PCB to perform said interface, wherein said at least two sets of electrical interconnection are performed via two flexible printed circuit (FPC) cables, and said at least two sets of electrical interconnection are respectively connectable to two opposite surfaces of said primary PCB.

11. The method as claimed in claim 10, wherein said primary PCB has two 50-pin PCI interfaces on said two opposite surfaces thereof, said at least two sets of electrical interconnection are respectively connected to said 50-pin PCI interfaces.

* * * * *